(12) United States Patent
Morikazu et al.

(10) Patent No.: US 8,258,045 B2
(45) Date of Patent: Sep. 4, 2012

(54) DEVICE PROCESSING METHOD

(75) Inventors: Hiroshi Morikazu, Ota-Ku (JP);
Noboru Takeda, Ota-ku (JP); Hirokazu Matsumoto, Ota-ku (JP)

(73) Assignee: Disco Corporation, Tokyo (JP)

( * ) Notice: Subject to any disclaimer, the term of this patent is extended or adjusted under 35 U.S.C. 154(b) by 231 days.

(21) Appl. No.: 12/770,290

(22) Filed: Apr. 29, 2010

(65) Prior Publication Data

US 2010/0297855 A1 Nov. 25, 2010

(30) Foreign Application Priority Data

May 21, 2009 (JP) .................................. 2009-123435

(51) Int. Cl.
*H01L 21/301* (2006.01)
(52) U.S. Cl. ................................ 438/463; 257/E21.347

(58) Field of Classification Search .................. 438/463, 438/940
See application file for complete search history.

(56) References Cited

U.S. PATENT DOCUMENTS

2006/0121697 A1* 6/2006 Fujii et al. ..................... 438/460

FOREIGN PATENT DOCUMENTS

JP 2007-019252 1/2007

* cited by examiner

*Primary Examiner* — Chandra Chaudhari
(74) *Attorney, Agent, or Firm* — Greer, Burns & Crain, Ltd.

(57) ABSTRACT

A device processing method for improving the die strength of a device divided from a semiconductor wafer. The device processing method includes a chamfering step of applying a pulsed laser beam having an absorption wavelength to the device along the periphery of the device to thereby chamfer the periphery of the device, wherein the pulse width of the pulsed laser beam to be applied in the chamfering step is set to 2 ns or less, and the peak energy density is set in the range of 5 to 200 $GW/cm^2$.

3 Claims, 7 Drawing Sheets

DEVICE PROCESSING METHOD

BACKGROUND OF THE INVENTION

1. Field of the Invention

The present invention relates to a device processing method for chamfering the periphery of a device by applying a pulsed laser beam.

2. Description of the Related Art

In a semiconductor device fabrication process, a plurality of crossing division lines called streets are formed on the front side of a substantially disk-shaped semiconductor wafer such as a silicon wafer and a gallium arsenide wafer to partition a plurality of regions where devices such as ICs and LSIs are respectively formed. The semiconductor wafer is divided into the individual devices along the division lines by using a cutting apparatus or a laser processing apparatus, and these devices are widely used in various electrical equipment such as mobile phones and personal computers.

In general, a dicing apparatus is used as the cutting apparatus. The dicing apparatus includes a cutting blade having a thickness of about 30 to 300 μm. The cutting blade is obtained by bonding super abrasive grains such as diamond and CBN (Cubic Baron Nitride) with metal or resin. Cutting is performed by rotating the cutting blade at a high speed of about 30000 rpm and feeding the cutting blade into a semiconductor wafer.

On the other hand, the laser processing apparatus essentially includes a chuck table for holding a semiconductor wafer, laser beam applying means for applying a pulsed laser beam to the semiconductor wafer held on the chuck table, and feeding means for relatively feeding the chuck table and the laser beam applying means. The pulsed laser beam has an absorption wavelength to the semiconductor wafer, and it is applied to the semiconductor wafer along the division lines formed on the front side of the semiconductor wafer to thereby form a plurality of laser processed grooves along these division lines. After forming the laser processed grooves, an external force is applied to the semiconductor wafer to break the semiconductor wafer along the laser processed grooves, thereby dividing the semiconductor wafer into the individual devices (see Japanese Patent Laid-open No. 2007-19252, for example).

SUMMARY OF THE INVENTION

In the case of cutting the semiconductor wafer by using the dicing apparatus having the cutting blade as mentioned above, each device divided from the semiconductor wafer has a die strength of 800 MPa. To the contrary, in the case of dividing the semiconductor wafer by performing a conventional laser processing method, each device divided from the semiconductor wafer has a die strength of 400 MPa. Such a low die strength causes a degradation in quality of electrical equipment.

It is therefore an object of the present invention to provide a device processing method which can improve the die strength of a device.

In accordance with an aspect of the present invention, there is provided a device processing method for improving the die strength of a device divided from a semiconductor wafer, the device processing method including a chamfering step of applying a pulsed laser beam having an absorption wavelength to the device along the periphery of the device to thereby chamfer the periphery of the device, wherein the pulse width of the pulsed laser beam to be applied in the chamfering step is set to 2 ns or less, and the peak energy density is set in the range of 5 to 200 GW/cm$^2$.

Preferably, the semiconductor wafer is fed to chamfer the periphery of the device in the chamfering step so that the overlap rate of the adjacent spots of the pulsed laser beam focused on the periphery of the device in a feeding direction is set to $^{16}/_{20}$ or more with respect to spot diameter. Preferably, the spot diameter is set in the range of 5 to 15 μm.

According to the present invention, in chamfering the periphery of the device by applying a pulsed laser beam having an absorption wavelength to the device, the pulse width of the pulsed laser beam is set to 2 ns or less, and the peak energy density per pulse of the pulsed laser beam is set in the range of 5 to 200 GW/cm$^2$. Accordingly, the die strength of the device can be improved to 800 MPa or more.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
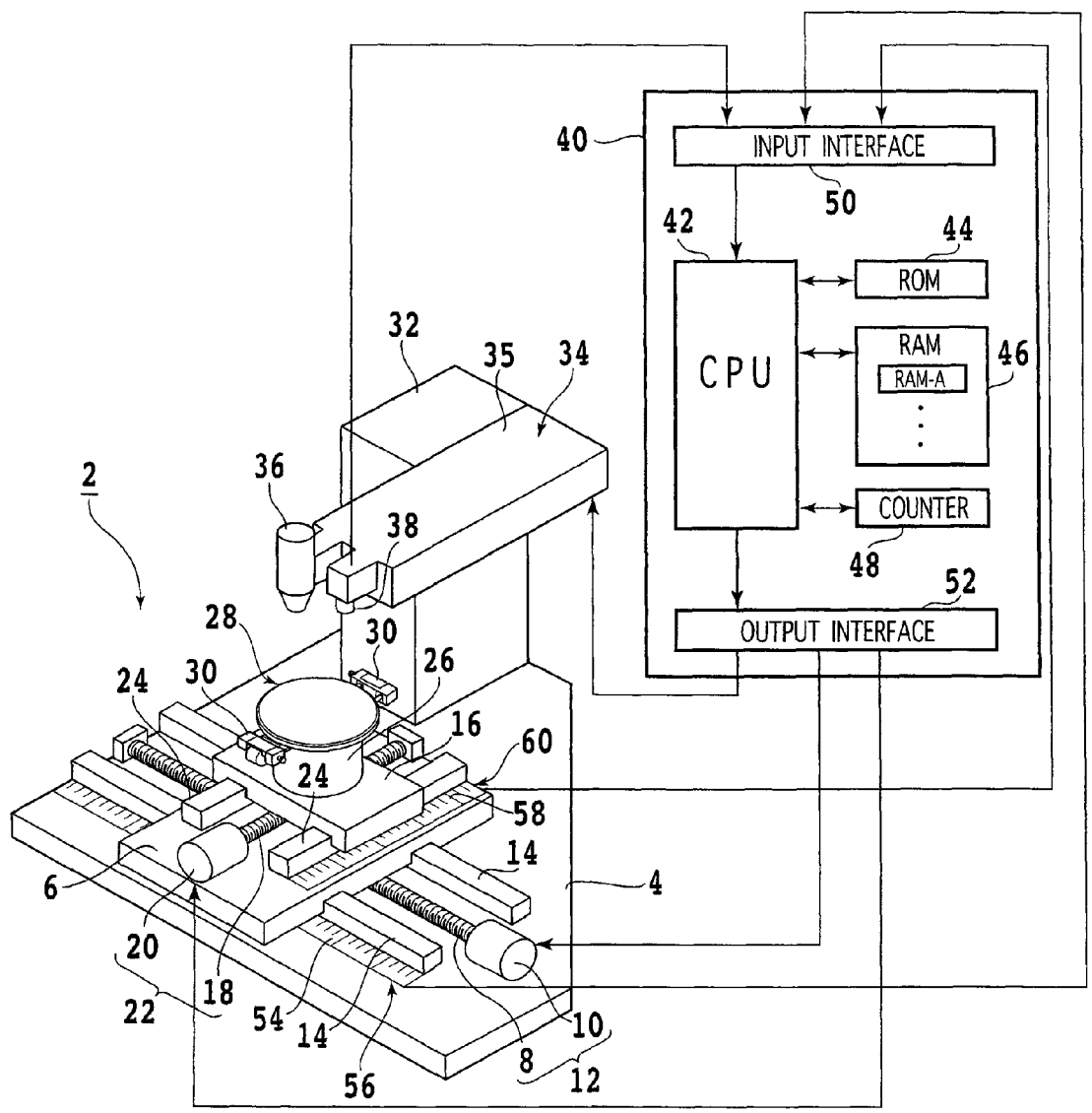
FIG. 1 is a schematic perspective view of a laser processing apparatus for performing the device processing method according to the present invention.

A preferred embodiment of the present invention will now be described in detail with reference to the drawings. FIG. 1 is a schematic perspective view of a laser processing apparatus 2 for performing the laser processing method according to the present invention. The laser processing apparatus 2 includes a stationary base 4 and a first slide block 6 supported to the stationary base 4 so as to be movable in an X direction in FIG. 1. The first slide block 6 is movable in a feeding direction, i.e., in the X direction along a pair of guide rails 14 by feeding means 12 including a ball screw 8 and a pulse motor 10.

A second slide block 16 is supported to the first slide block 6 so as to be movable in a Y direction in FIG. 1. The second slide block 16 is movable in an indexing direction, i.e., in the Y direction along a pair of guide rails 24 by indexing means 22 including a ball screw 18 and a pulse motor 20. A chuck table 28 is supported through a cylindrical support member 26 to the second slide block 16. Accordingly, the chuck table 28 is movable both in the X direction and in the Y direction by the feeding means 12 and the indexing means 22. The chuck table 28 is provided with a pair of clamps 30 for clamping a semiconductor wafer (which will be hereinafter described) held on the chuck table 28 under suction.

Figure 3:
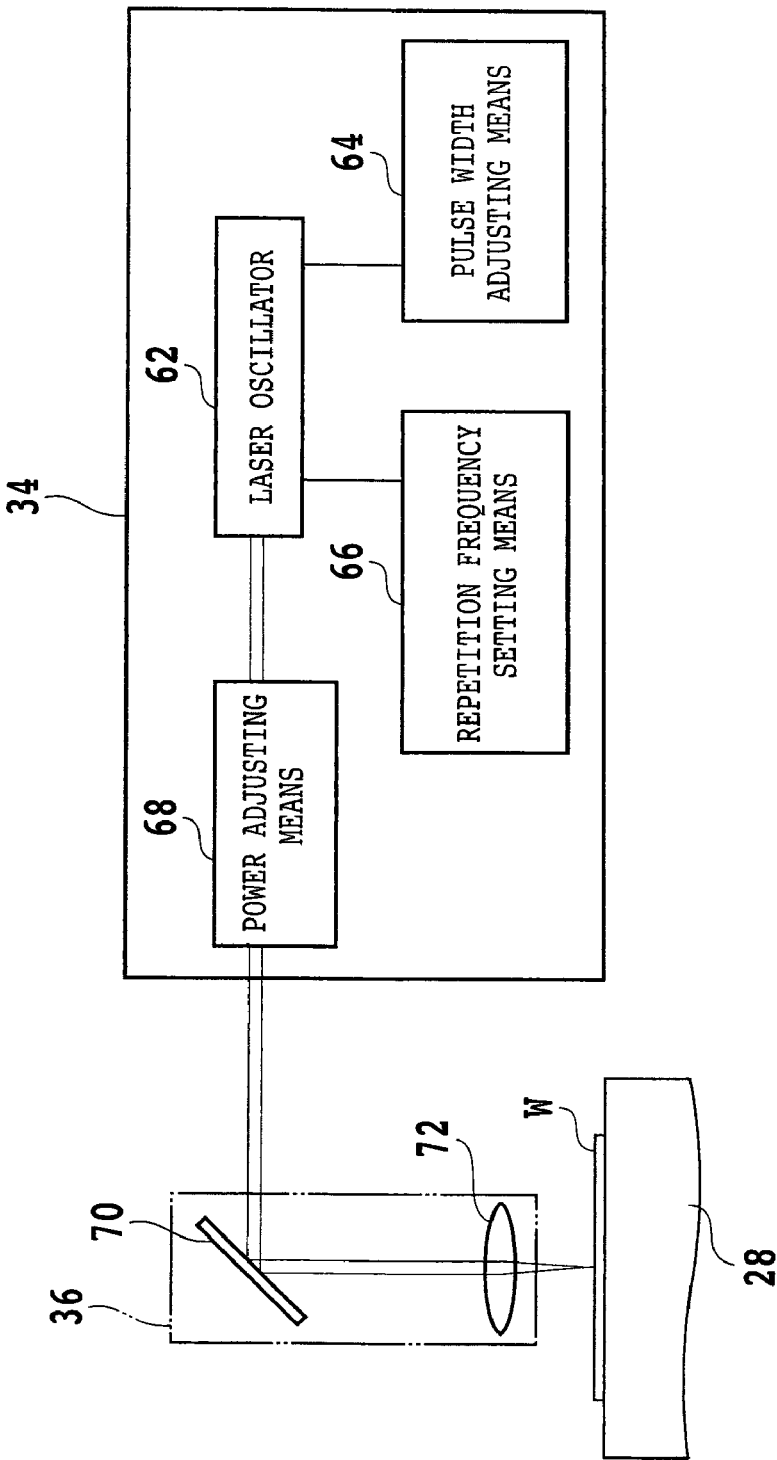
FIG. 3 is a block diagram of a laser beam applying unit.

A column 32 is provided on the stationary base 4, and a casing 35 for accommodating a laser beam applying unit 34 is mounted on the column 32. As shown in FIG. 3, the laser beam applying unit 34 includes a laser oscillator 62 such as a YAG laser oscillator or a YVO4 laser oscillator, repetition frequency setting means 64, pulse width adjusting means 66, and power adjusting means 68. A pulsed laser beam is oscillated by the laser oscillator 62, and the power of the pulsed laser beam is adjusted by the power adjusting means 68. Focusing means 36 is mounted at the front end of the casing 35 and includes a mirror 70 and a focusing objective lens 72. The pulsed laser beam from the laser beam applying unit 34 is reflected by the mirror 70 and next focused by the objective lens 72 in the focusing means 36 so as to form a laser beam spot on the front side (upper surface) of a semiconductor wafer W held on the chuck table 28.

Referring back to FIG. 1, imaging means 38 for detecting a processing area of the semiconductor wafer W to be laser-processed is also provided at the front end of the casing 35 so as to be juxtaposed to the focusing means 36 in the X direction. The imaging means 38 includes an ordinary imaging device such as a CCD for imaging the processing area of the semiconductor wafer W by using visible light. The imaging means 38 further includes infrared imaging means composed of infrared light applying means for applying infrared light to the semiconductor wafer W, an optical system for capturing the infrared light applied to the semiconductor wafer W by the infrared light applying means, and an infrared imaging device such as an infrared CCD for outputting an electrical signal corresponding to the infrared light captured by the optical system. An image signal output from the imaging means 38 is transmitted to a controller (control means) 40.

The controller 40 is configured by a computer, and it includes a central processing unit (CPU) 42 for performing operational processing according to a control program, a read only memory (ROM) 44 for storing the control program and so on, a random access memory (RAM) 46 for storing the results of computation, etc., a counter 48, an input interface 50, and an output interface 52.

Reference numeral 56 denotes feed amount detecting means including a linear scale 54 provided along one of the guide rails 14 and a read head (not shown) provided on the first slide block 6. A detection signal from the feed amount detecting means 56 is input into the input interface 50 of the controller 40. Reference numeral 60 denotes index amount detecting means including a linear scale 58 provided along one of the guide rails 24 and a read head (not shown) provided on the second slide block 16. A detection signal from the index amount detecting means 60 is input into the input interface 50 of the controller 40. An image signal from the imaging means 38 is also input into the input interface 50 of the controller 40. On the other hand, control signals are output from the output interface 52 of the controller 40 to the pulse motor 10, the pulse motor 20, and the laser beam applying unit 34.

Figure 2:
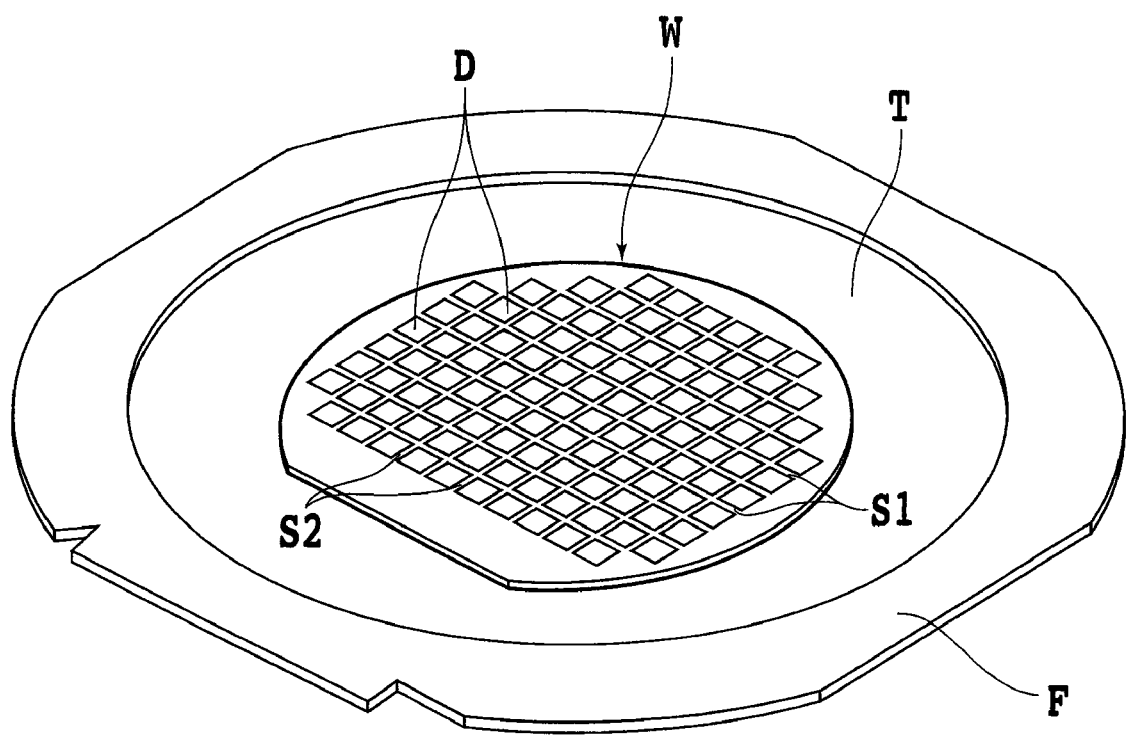
FIG. 2 is a perspective view of a semiconductor wafer supported through a dicing tape to an annular frame.

As shown in FIG. 2, the front side of the semiconductor wafer W as a workpiece to be processed by the laser processing apparatus 2 is formed with a plurality of first streets S1 and a plurality of second streets S2 perpendicular to the first streets S1, thereby partitioning a plurality of rectangular regions where a plurality of devices D are respectively formed. The semiconductor wafer W is attached to a dicing tape T as an adhesive tape, and the dicing tape T is supported at its outer circumferential portion to an annular frame F. Accordingly, the semiconductor wafer W is supported through the dicing tape T to the annular frame F. The semiconductor wafer W is held on the chuck table 28 shown in FIG. 1 under suction in the condition where the annular frame F is clamped by the clamps 30.

Figure 4:
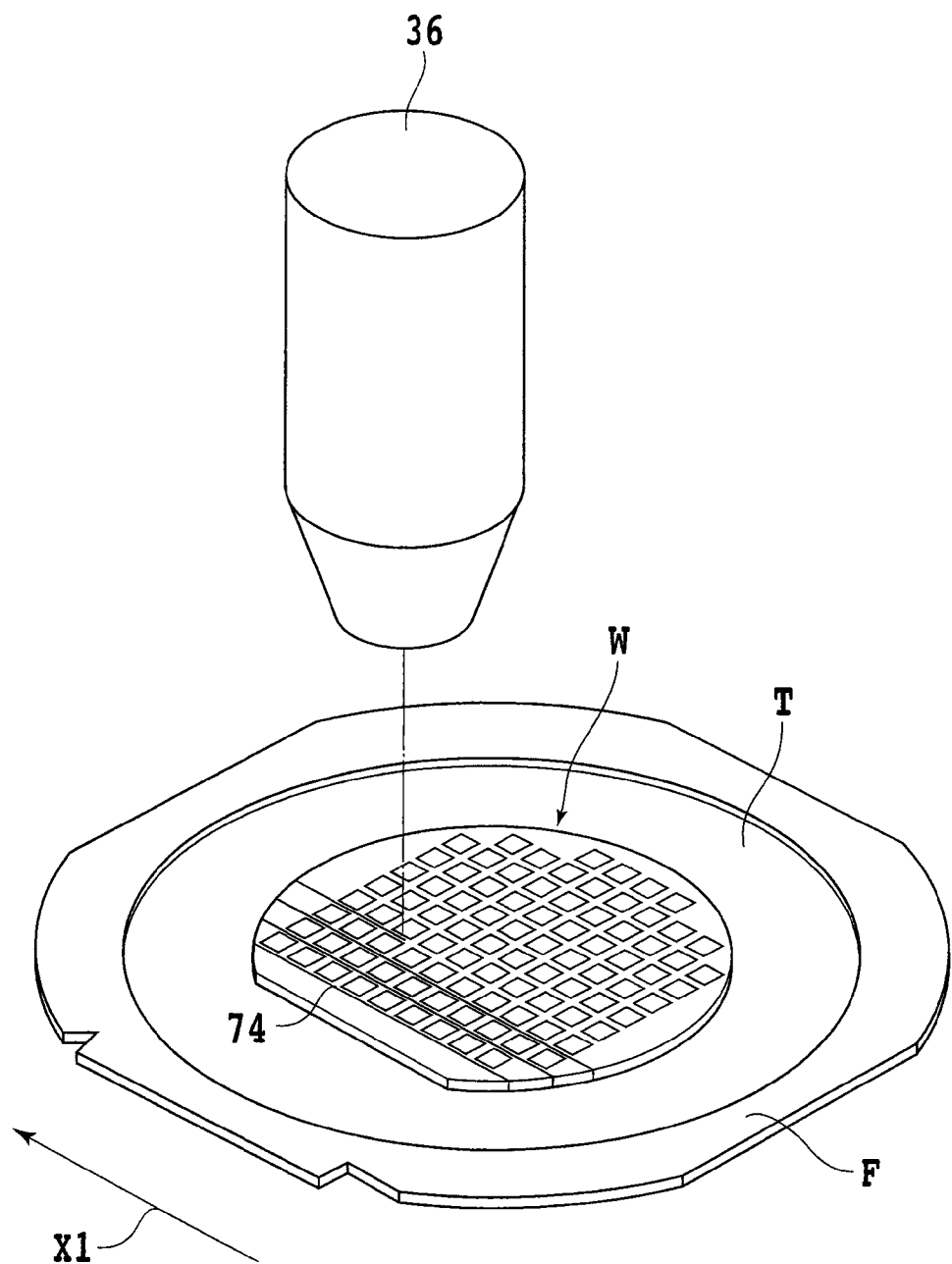
FIG. 4 is a perspective view showing a groove forming step by laser processing.
Figure 5A:
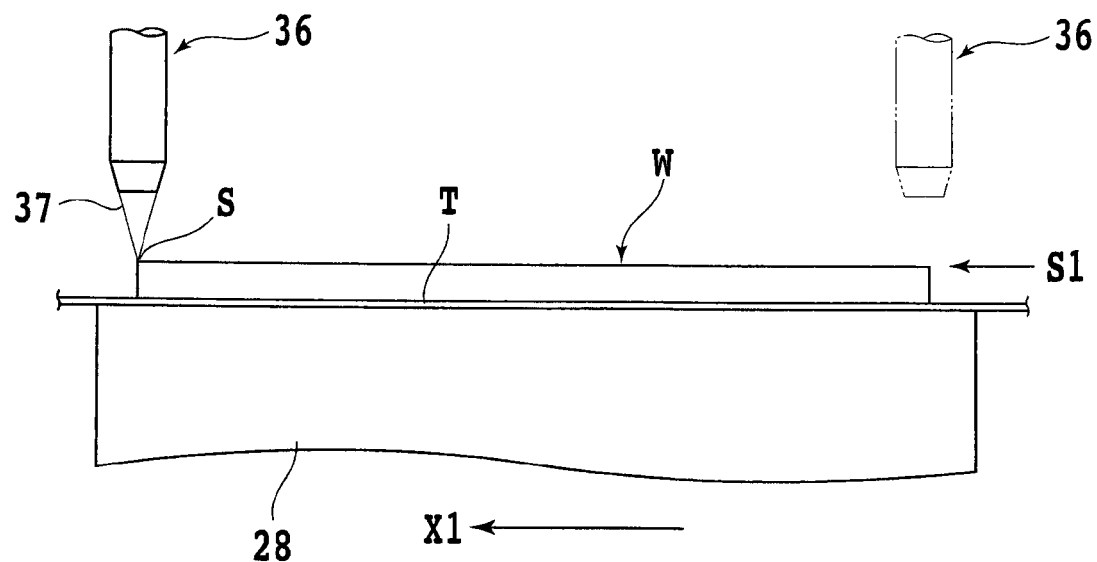
FIG. 5A is a sectional side view for illustrating the groove forming step.
Figure 5B:
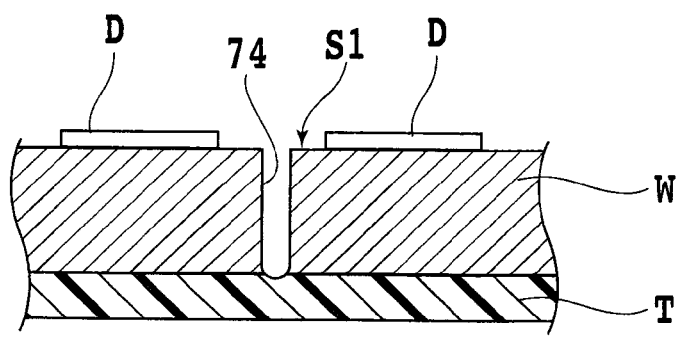
FIG. 5B is an enlarged sectional view of the semiconductor wafer at a position where a laser processed groove is formed by the groove forming step shown in FIG. 5A.

A laser processing method for the semiconductor wafer W to be performed by using the laser processing apparatus 2 shown in FIG. 1 will now be described with reference to FIGS. 4 to 5B. As shown in FIGS. 4 and 5A, a pulsed laser beam 37 having an absorption wavelength to the semiconductor wafer W is focused by the focusing means 36 onto the front side of the semiconductor wafer W. At the same time, the chuck table 28 is moved in a direction shown by an arrow X1 in FIG. 5A at a predetermined feed speed from one end (left end as viewed in FIG. 5A) of a predetermined one of the first streets S1.

When the other end (right end as viewed in FIG. 5A) of this predetermined first street S1 reaches the laser beam applying position of the focusing means 36, the application of the pulsed laser beam is stopped and the movement of the chuck table 28 is also stopped. As a result, a laser processed groove 74 having a depth substantially equal to the thickness of the semiconductor wafer W is formed along this predetermined first street S1 as shown in FIG. 5B, thereby dividing the semiconductor wafer W along this predetermined first street S1. Such a groove forming step for forming the laser processed groove 74, i.e., a wafer dividing step is performed similarly along the other first streets S1. After thus performing the groove forming step along all of the first streets S1, the chuck table 28 is rotated 90° to similarly perform the groove forming step along all of the second streets S2 perpendicular to the first streets S1. As a result, the laser processed grooves 74 are formed along all of the first and second streets S1 and S2 to thereby divide the semiconductor wafer W into the individual devices D.

The groove forming step mentioned above is performed under the following conditions, for example.

Light source: YAG laser or YVO4 laser
Wavelength: 355 nm (third harmonic generation of the above light source)
Average power: 7 W
Repetition frequency: 10 kHz
Pulse width: 30 ns
Feed speed: 200 mm/s When the bottom of each laser processed groove 74 reaches the back side (lower surface) of the semiconductor wafer W in the groove forming step mentioned above, the dicing tape T is irradiated with the pulsed laser beam. However, since the dicing tape T is formed from a synthetic resin tape such as a polyolefin tape, the pulsed laser beam is passed through the dicing tape T and does not fuse the dicing tape T.

Figure 6:
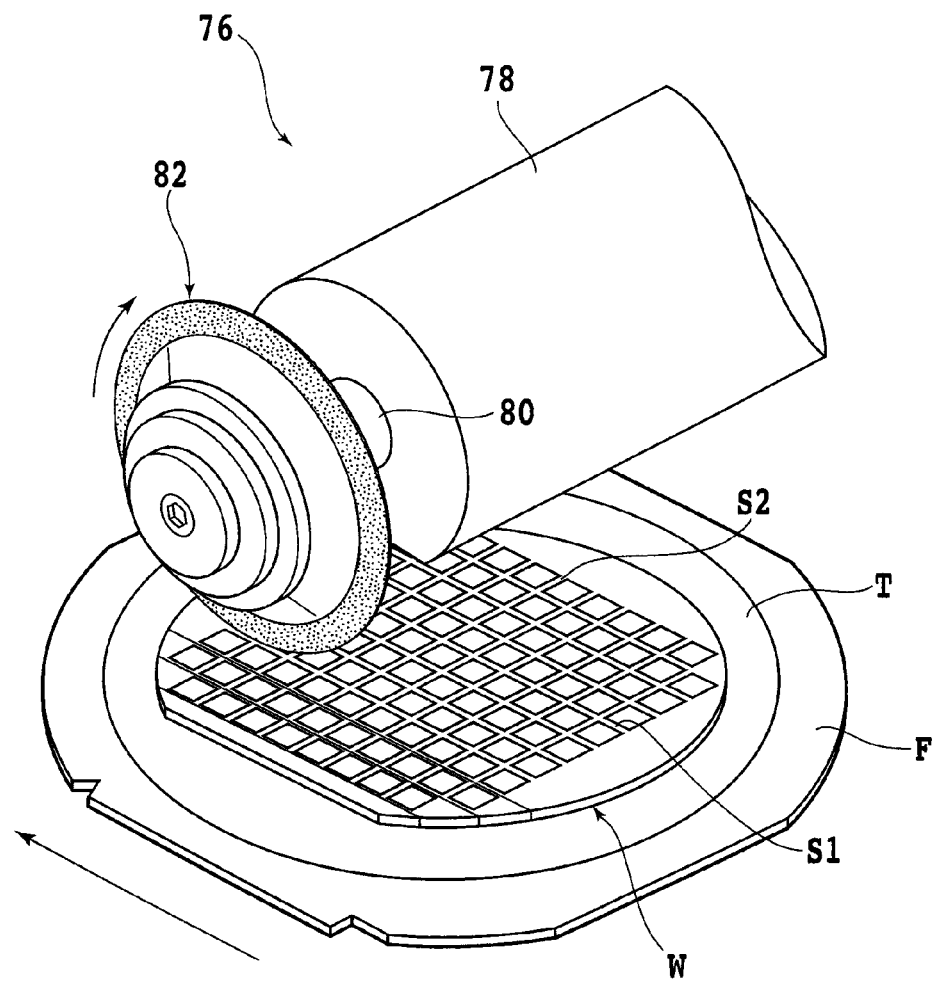
FIG. 6 is a perspective view showing a dicing step.

The semiconductor wafer W may be cut by using a dicing apparatus instead of the laser processing apparatus 2 shown in FIG. 1. The dicing apparatus includes a cutting unit 76 shown in FIG. 6. The cutting unit 76 includes a spindle casing 78, a spindle 80 rotatably accommodated in the spindle casing 78 so as to project from the front end of the spindle casing 78, and a cutting blade 82 mounted at the front end of the spindle 80. In the condition where a predetermined one of the first streets S1 to be cut is aligned to the cutting blade 82, a chuck table (not shown) holding the semiconductor wafer W is moved in the X direction as rotating the cutting blade 82 at a high speed. As a result, the semiconductor wafer W is cut along this predetermined first street S1 by the cutting blade 82.

Thereafter, the chuck table holding the semiconductor wafer W is indexed in the Y direction with a predetermined street pitch stored in a memory, thereby cutting the semiconductor wafer W along all of the first streets S1. Thereafter, the chuck table is rotated 90° to similarly perform the above cutting operation along all of the second streets S2 perpendicular to the first streets S1. As a result, the semiconductor wafer W is divided into the individual devices D.

As mentioned above, in the case of cutting the semiconductor wafer W by using the dicing apparatus having the cutting blade 82, the die strength of each device D divided from the semiconductor wafer W is 800 MPa. However, in the case of dividing the semiconductor wafer W by performing the laser processing method described above with reference to FIGS. 4 to 5B, the die strength of each device D divided from the semiconductor wafer W is 400 MPa. Such a low die strength causes a degradation in quality of electrical equipment. According to the present invention, it has been found that the die strength of each device D divided from the semiconductor wafer W can be improved by applying a pulsed laser beam to the periphery of each device D under predetermined conditions to thereby chamfer the periphery of each device D. This improvement in die strength of each device D is also applicable to each device D divided by the dicing apparatus shown in FIG. 6.

Figure 7:
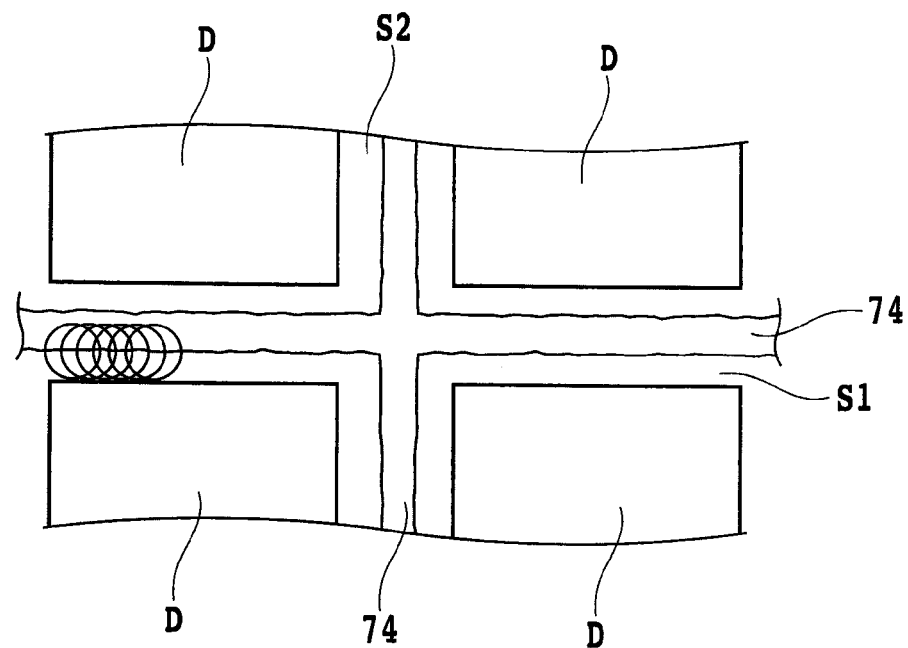
FIG. 7 is an enlarged plan view showing a chamfering step.
Figure 8:
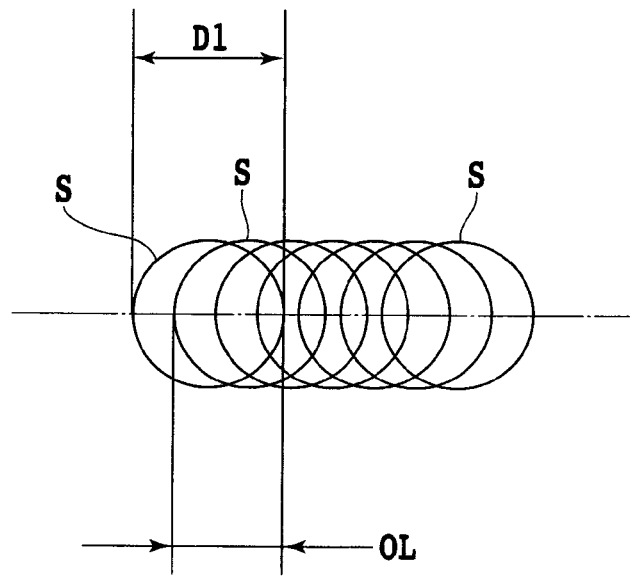
FIG. 8 is a schematic diagram for illustrating the amount of overlap between adjacent beam spots.

In the device processing method according to the present invention, as shown in FIG. 7, a pulsed laser beam having an absorption wavelength to the semiconductor wafer W is applied along the periphery of each device D, i.e., along the edge of each laser processed groove 74 to thereby chamfer the periphery of each device D. As a result, the die strength of each device D can be improved. In the device processing method according to the present invention, as shown in FIG. 8, the overlap amount OL of the adjacent spots S of the pulsed laser beam in the feeding direction is preferably adjusted to fall within the range of $16D1/20 \leq OL \leq 19D1/20$, where D1 is the spot diameter of the pulsed laser beam, by optimally setting the repetition frequency, pulse width, spot diameter D1, and feed speed of the pulsed laser beam applied from the focusing means 36.

The object of the present invention is to improve the die strength of each device D obtained by dividing the semiconductor wafer W, and the following test was carried out to examine the processing conditions for attaining a die strength of 800 MPa or more for each device D manufactured by the laser processing method described above.

Pulsed laser beams having wavelengths of 1064 nm, 532 nm, and 355 nm were used and the pulse width of each pulsed laser beam was changed to 30 ns, 10 ns, 5 ns, 3 ns, 2 ns, 1 ns, 100 ps, 50 ps, and 10 ps. In each pulse width, the power was changed to experimentally obtain an energy per pulse for attaining desired laser processing. This energy was divided by the pulse width and the spot area to thereby calculate a peak energy density. Then, the relation between the pulse width, the peak energy density, and the die strength was examined.

The peak energy density is given by the following equation.

$$\text{Peak energy density (W/cm}^2\text{)} = \text{Average power (W)} / (\text{Repetition frequency (Hz)} \times \text{Spot area (cm}^2\text{)} \times \text{Pulse width (s))}$$

As a result, the following results were similarly obtained for all of the pulsed laser beams having the wavelengths of 1064 nm, 532 nm, and 355 nm.

(Test 1)
The semiconductor wafer was processed to form the laser processed grooves under the following conditions.
Repetition frequency: 10 kHz
Average power: 0.1 W
Pulse width: 2 ns
Spot diameter: 10 μm
Feed speed: 10 mm/s
Peak energy density: 6.35 GW/cm$^2$
The semiconductor wafer was next divided along the laser processed grooves to obtain the individual devices.
The die strength of each device was measured to attain 800 MPa.

(Test 2)
The semiconductor wafer was processed to form the laser processed grooves under the following conditions.
Repetition frequency: 100 kHz
Average power: 0.1 W
Pulse width: 10 ps
Spot diameter: 10 μm
Feed speed: 100 mm/s
Peak energy density: 63.66 GW/cm$^2$
The semiconductor wafer was next divided along the laser processed grooves to obtain the individual devices. The die strength of each device was measured to attain 1800 MPa.

(Test 3)
The semiconductor wafer was processed to form the laser processed grooves under the following conditions.
Repetition frequency: 100 kHz
Average power: 0.3 W
Pulse width: 10 ps
Spot diameter: 10 μm
Feed speed: 100 mm/s
Peak energy density: 190.9 GW/cm$^2$
The semiconductor wafer was next divided along the laser processed grooves to obtain the individual devices. The die strength of each device was measured to attain 1000 MPa.

(Test 4)
The semiconductor wafer was processed to form the laser processed grooves under the following conditions.
Repetition frequency: 100 kHz
Average power: 0.4 W
Pulse width: 10 ps
Spot diameter: 10 μm
Feed speed: 100 mm/s
Peak energy density: 254.6 GW/cm$^2$
The semiconductor wafer was next divided along the laser processed grooves to obtain the individual devices. The die strength of each device was measured to attain 500 MPa.

(Test 5)
The semiconductor wafer was processed to form the laser processed grooves under the following conditions.
Repetition frequency: 10 kHz
Average power: 1.0 W
Pulse width: 10 ns
Spot diameter: 10 μm
Feed speed: 10 mm/s
Peak energy density: 12.7 GW/cm$^2$
The semiconductor wafer was next divided along the laser processed grooves to obtain the individual devices. The die strength of each device was measured to attain 400 MPa.

(Test 6)
The semiconductor wafer was processed to form the laser processed grooves under the following conditions.
Repetition frequency: 10 kHz
Average power: 1.0 W
Pulse width: 5 ns
Spot diameter: 10 μm
Feed speed: 10 mm/s
Peak energy density: 25.4 GW/cm$^2$
The semiconductor wafer was next divided along the laser processed grooves to obtain the individual devices. The die strength of each device was measured to attain 500 MPa.

(Test 7)

The semiconductor wafer was processed to form the laser processed grooves under the following conditions.

Repetition frequency: 10 kHz
Average power: 0.1 W
Pulse width: 3 ns
Spot diameter: 10 μm
Feed speed: 10 mm/s
Peak energy density: 4.2 GW/cm$^2$ The semiconductor wafer was next divided along the laser processed grooves to obtain the individual devices. The die strength of each device was measured to attain 550 MPa.

(Test 8)

The semiconductor wafer was processed to form the laser processed grooves under the following conditions.

Repetition frequency: 10 kHz
Average power: 0.2 W
Pulse width: 3 ns
Spot diameter: 10 μm
Feed speed: 10 mm/s
Peak energy density: 8.2 GW/cm$^2$ The semiconductor wafer was next divided along the laser processed grooves to obtain the individual devices. The die strength of each device was measured to attain 500 MPa.

(Test 9)

The semiconductor wafer was processed to form the laser processed grooves under the following conditions.

Repetition frequency: 10 kHz
Average power: 0.07 W
Pulse width: 2 ns
Spot diameter: 10 μm
Feed speed: 10 mm/s
Peak energy density: 4.5 GW/cm$^2$ The semiconductor wafer was next divided along the laser processed grooves to obtain the individual devices. The die strength of each device was measured to attain 550 MPa.

From these test results, it is concluded that the pulse width of the pulsed laser beam to be applied in the chamfering step must be set to 2 ns or less and the peak energy density must be set in the range of 5 to 200 GW/cm$^2$ in order to obtain a deice having a die strength of 800 MPa or more.

The device processing method according to the present invention is especially suitable for the improvement in die strength of each device D divided from the semiconductor wafer W by the application of a laser beam. However, the device processing method according to the present invention may be applied to each device D divided from the semiconductor wafer W by a dicing apparatus. In this case, the die strength of each device D before chamfering can be further improved from 800 MPa.

Further, as described above with reference to FIG. 8, the overlap rate of the adjacent spots S in the feeding direction is preferably set in the range of $16/20$ to $19/20$ with respect to spot diameter. Further, the spot diameter of the laser beam focused on the semiconductor wafer W is preferably set in the range of 5 to 15 μm.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A device processing method for improving the die strength of a device divided from a semiconductor wafer, said device processing method comprising:
   a dividing step of dividing said semiconductor wafer into individual devices,
   a chamfering step of applying a pulsed laser beam having an absorption wavelength to said device along the periphery of said device to thereby chamfer the periphery of said device, wherein:
   the pulse width of said pulsed laser beam to be applied in said chamfering step is set to 2 ns or less, and the peak energy density is set in the range of 5 to 200 GW/cm$^2$.

2. The device processing method according to claim 1, wherein said semiconductor wafer is fed to chamfer the periphery of said device in said chamfering step so that an overlap rate of adjacent spots of said pulsed laser beam focused on the periphery of said device in a feeding direction is set to $16/20$ or more with respect to a spot diameter of said pulsed laser beam.

3. The device processing method according to claim 2, wherein said spot diameter is set in the range of 5 to 15 μm.

* * * * *